United States Patent [19]
Ohta

[11] 4,293,929
[45] Oct. 6, 1981

[54] MAGNETIC BUBBLE MEMORY DEVICES

[75] Inventor: Hirofumi Ohta, Mobara, Japan
[73] Assignee: Hitachi, Ltd., Tokyo, Japan
[21] Appl. No.: 67,121
[22] Filed: Aug. 16, 1979
[30] Foreign Application Priority Data
 Aug. 23, 1978 [JP] Japan .............................. 53-101774
[51] Int. Cl.³ ............................................ G11C 19/08
[52] U.S. Cl. ...................................................... 365/2
[58] Field of Search ............................................ 365/2
[56] References Cited
 U.S. PATENT DOCUMENTS
 4,058,801 11/1977 Voegeli ................................... 365/2
 4,160,274 7/1979 Stephenson, Jr. et al. ............. 365/2

Primary Examiner—James W. Moffitt
Attorney, Agent, or Firm—Charles E. Pfund

[57] ABSTRACT

Around the magnetic bubble memory chip placed within a recess formed at approximate center of the insulating substrate are arranged a plurality of rod-like members of soft ferromagnetic material to be on substantially the same plane as the major surface of the chip. The intensity of the rotating magnetic field generated by the coils wound around the outer periphery of the insulating substrate encircling the chip is amplified by the plurality of rod-like members.

6 Claims, 14 Drawing Figures

MAGNETIC BUBBLE MEMORY DEVICES

BACKGROUND OF THE INVENTION

The present invention concerns magnetic bubble memory devices, and more particularly it concerns magnetic bubble memory devices wherein the intensity of the rotating magnetic field is amplified without increasing the amplitude of the current for generating the rotating magnetic field.

Generally, a magnetic bubble memory device comprises a magnetic thin film formed on a non-magnetic substrate such as made of garnet by liquid phase epitaxial growth process or the like, a magnetic bubble memory chip comprising soft ferromagnetic material formed on the magnetic thin film and a pattern made of conductive material, an insulating substrate to carry the chip, signal transmission leads to electrically connect the chip and an external circuit, X and Y coils to generate a rotating magnetic field which is parallel to the major surface of the chip, and a permanent magnet to generate a bias magnetic field which is vertical to the major surface of the chip. The device writes in, memorizes and reads out the desired information by causing the magnetic bubbles to generate, propagate and replicate in the thin film pattern comprising the soft ferromagnetic material.

However, there were major problems to be solved, as listed below, in the conventional art for providing a compact and large capacity magnetic bubble memory device constructed as above at low prices, and these problems hindered the practical materialization of the device.

(1) Miniaturization of coils for rotating magnetic field:

In order to obtain a compact magnetic bubble memory device, it is necessary to miniaturize X, Y coils for rotating magnetic field.

(2) Minimization of voltage-current (VI) product in coils for rotating magnetic field:

When a current of more than 100 KHz is supplied to X, Y coils for rotating magnetic field, terminal voltage at X, Y coils become excessive, thereby causing problems concerning allowable voltage for transistors for the driving circuit. In this case, it is desirable to avoid using transistors with a high allowable voltage but use inexpensive integrated circuits (IC) for driving purposes.

(3) Minimization of power consumption:

Generally speaking, performance characteristics of magnetic bubble memory devices as such that they are dependant on temperature; when the temperature in the chip rises, the operation margin becomes smaller. Accordingly, it is necessary to decrease the power consumption at X, Y coils which greatly take part in the generation of heat.

(4) As for bias magnetic field margin indicating operational characteristics of a magnetic bubble memory device (the range of bias magnetic field in which the device can operate stably), the bias magnetic field margin becomes wider as the intensity of the rotating magnetic field increases, and as the diameter of the magnetic bubble becomes smaller, the level of the margin becomes higher and shifts toward the direction in which the rotating magnetic field intensity increases. Therefore, if the bubble diameter is decreased to make the magnetic bubble memory device more compact and increase its capacity, then a large rotating magnetic field is required in order to operate the magnetic bubble memory device stably. For this purpose, the amplitude of the current supplied to X, Y coils must be increased, which fact contradicts the points raised above in (2) and (3).

(5) Magnetic field intensity in the direction of X within X coil, and that in the direction of Y within Y coil respectively become maximum at the center of the lengths of X, Y coils, and decrease toward the opposite end openings of the coils. For this reason, the level of the maximum value at the center rises if it is intended to obtain a sufficient intensity of magnetic field at the opposite ends, which in turn increases the power consumed at X, Y coils and raises the temperature in the chip.

As explained above, in the conventional type magnetic bubble memory device, the amplitude of the current for generating the rotating magnetic field must be increased in order to increase the intensity of the rotating magnetic field, which in turn increases the power consumption at X, Y coils, raises the chip temperature, and deteriorates the operation margin.

SUMMARY OF THE INVENTION

An object of the present invention is, therefore, to obviate the above mentioned drawbacks of the prior art, and to provide a magnetic bubble memory device which can decrease the power consumption at the coils to suppress the temperature rise in the chip by amplifying the intensity of the rotating magnetic field applied to the chip instead of changing the amplitude of the current supplied to the coils for generating the rotating magnetic field, thereby improving the operation margin.

In order to achieve the above object of the invention, in the magnetic bubble memory device in accordance with the present invention, soft ferromagnetic members are arranged in the rotating magnetic field formed by the coils for generating the rotating magnetic field, and the magnetic bubbles are operated by utilizing a magnetic field generated by magnetizing the soft ferromagnetic members with the rotating magnetic field.

BRIEF DESCRIPTION OF THE DRAWINGS

Other objects, features and advantages of the present invention will become further clear by the following detailed explanation made in reference to the attached drawings wherein.

DESCRIPTION OF PREFERRED EMBODIMENTS

Figure 1:
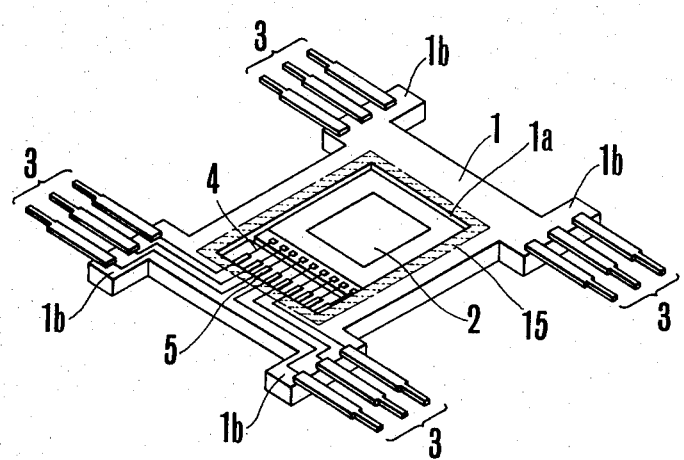
FIG. 1 is an illustration of one embodiment of the magnetic bubble memory device in accordance with the present invention, wherein a partial perspective view of the device from which the rotating magnetic field coils have been removed is shown.

FIG. 1 shows an embodiment of the magnetic bubble memory device in accordance with the present invention, and more particularly it shows a component inside a ceramic package of the magnetic bubble memory device. In the figure, an insulating substrate 1 made of such a material as ceramics has a recess 1a formed in the flat center part of substrate 1, the four corners thereof respectively terminating in an L shaped lead mount 1b. Inside the recess 1a of the substrate 1 is housed a magnetic bubble memory chip 2. A plurality of permalloy rods are arranged around the chip 2 and within a recessed area 15, hatched with phantom lines, surrounding the recess 1a. Reference will be made to these parmalloy rods later. To the lead mounts 1b are respectively mounted a plurality of lead pins 3. A typical terminal for the internal wiring of the magnetic bubble memory chip 2 is connected to a printed board terminal 5 formed on the substrate 1 via a bonding wire 4, printed board terminal 5 extending to the lead mount 1b along the substrate 1 and connected electrically to the lead pin 3.

Figure 2:
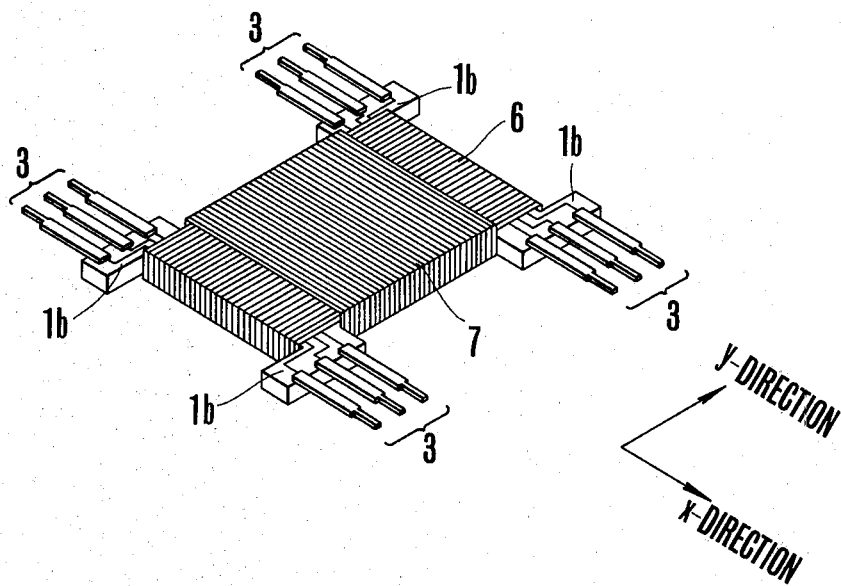
FIG. 2 is a perspective view of the device of FIG. 1 wound with the rotating magnetic field coils.
Figure 3:
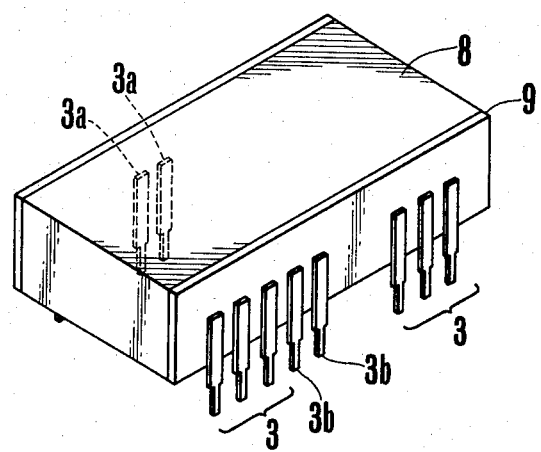
FIG. 3 is a perspectiv view of the shield casing for housing the device.

The ceramic package thus constructed is wound with X coil 6 in the longitudinal direction of the substrate 1 and with Y coil 7 thereupon in the lateral direction thereof as shown in FIG. 2. By supplying sine wave currents which are mutually out of phase by 90° to X coil 6 and Y coil 7, a rotating magnetic field of usually about 30-60 Oersteds generates in parallel to the major surface of the magnetic bubble memory chip 2. Outside these X coil 6 and Y coil 7 are provided a pair of permanent magnets in a sheet form (not shown) which imparts a uniform bias magnetic field perpendicular to the surface of the magnetic bubble memory chip 2 and a yoke in a fashion as to sandwich the X coil 6 and Y coil 7. As shown in FIG. 3, this assembly is housed within a shield casing 8 with the lead pins 3 penetrating through a side wall 9, extending beyond the casing and being bent downward. Reference numbers 3a and 3b denote lead pins for X coil 6 and Y coil 7 respectively.

Figure 4:
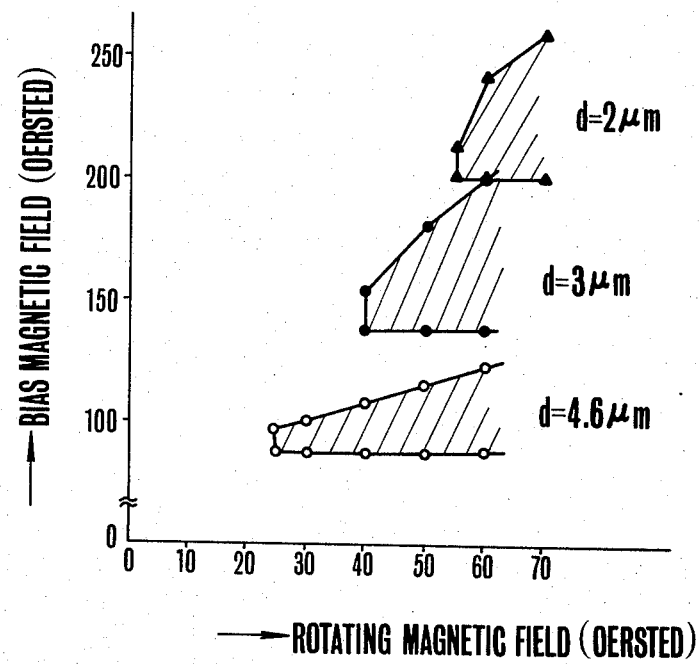
FIG. 4 is a graph showing bias magnetic field margin in relation to rotating magnetic field.

FIG. 4 shows the relation between the bias magnetic field margin and the intensity of rotating magnetic field in the magnetic bubble memory device constructed as above mentioned.

Figure 5:
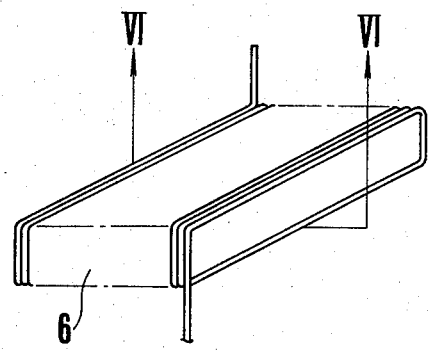
FIG. 5 is a perspective view showing an X coil for generating rotating magnetic field.
Figure 6:
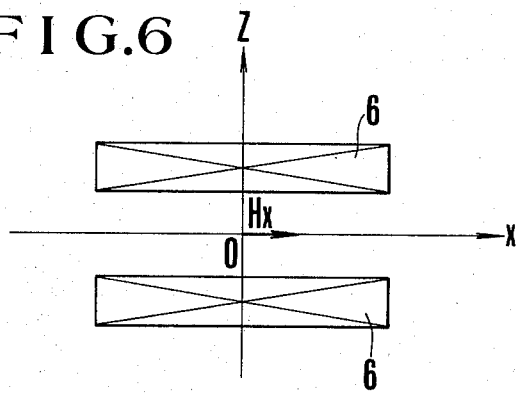
FIG. 6 is a cross-sectional view along line VI—VI in FIG. 5.

The X coil 6 for generating rotating magnetic field shown in FIG. 2 is illustrated in perspective form in FIG. 5 and in cross-sectional form along line VI—VI in FIG. 6.

Figure 7:
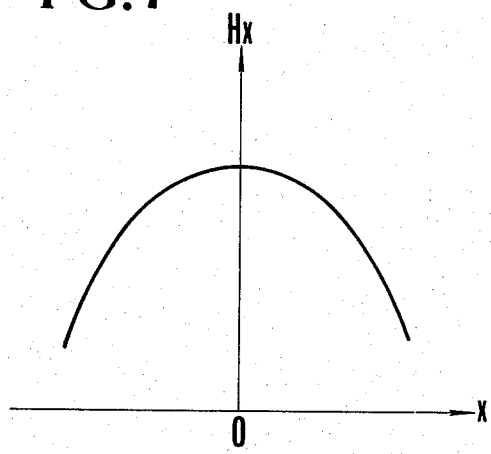
FIG. 7 is a graph showing the intensity distribution in the direction of X of the rotating magnetific field generated by X coil of FIG. 5.

FIG. 7 shows the intensity distribution in the direction of x of the magnetic field component Hx generated by X coil 6 (see FIG. 2). The intensity distribution in the direction of y of the magnetic field component in the direction of y generated by Y coil 7 for generating rotating magnetic field (see FIG. 2) is the same as that shown in FIG. 7 and therefore the description thereof will not be given.

As is clear from FIG. 7, the magnetic field intensity in the direction x within X coil 6 becomes maximum at the center O of the length of X coil 6, and tapers off toward the opening. The coil 6 shown in FIG. 5 is about 18 mm long, about 12 mm wide and about 2.3 mm high, and is formed of a doublelayer winding of a wire having a diameter of about 0.2 mm. The relation of the current and the magnetic field at X coil 6 is about 10 Oersteds/100 mA. The total power consumption of X coil 6 and Y coil 7 is about 400 mW when the rotating magnetic field is about 40 Oersteds, 860 mW when it is 60 Oersteds, and 1.6 W when 80 Oersteds. The temperature rise in the chip is about 15° C. when the rotating magnetic field is about 40 Oersteds, 32° C. when it is 60 Oersteds, and 70° C. when 80 Oersteds. With the intensity of 80 Oersteds, the chip has completely stopped functioning.

As explained above, when rotating magnetic field with a high intensity is generated by X coil 6 and Y coil 7 alone, the chip temperature rises remarkably because of an excessive coil current. Therefore, permalloy rods are arranged around the chip 2 (in the area 15 hatched with phantom lines in FIG. 1) in the present invention to increase the amplitude of the rotating magnetic field generated by X, Y coils, thereby decreasing the amplitude of the coil current required for generating the rotating magnetic field with a sufficient intensity to operate the chip.

Figure 8:
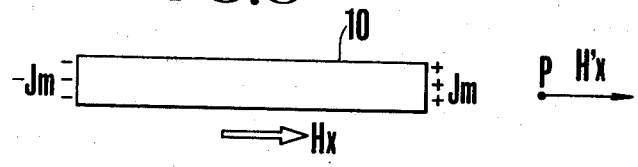
FIG. 8 is a diagram for explaining magnetic field amplification.

Now referring to FIG. 8, an explanation of the principle of amplification of the rotating magnetic field applied to the chip is made. In the figure, when rod-shaped soft ferromagnetic members 10 which are arranged in a uniform magnetic field are magnetized by an external magnetic field component Hx in the direction of an arrow, a surface magnetic charge Jm is generated at the end of the soft ferromagnetic members 10. When the magnetic field created at a point P by the surface magnetic charge Jm is denoted H″, the resultant magnetic field Hx′ at the point P becomes $$Hx' = Hx + Hx'',$$

thus amplifying the magnetic field intensity.

Figure 9A:
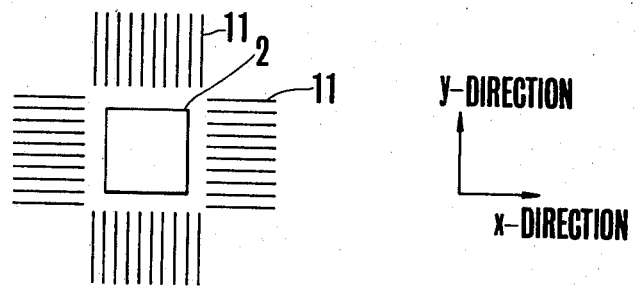
FIGS. 9A and 9B are respectively a plan view and a cross-sectional view showing one example of the arrangement of permalloy rods.
Figure 9B:
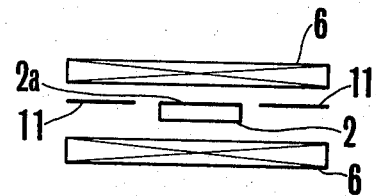

FIG. 9A shows an example of an arrangement of the permalloy rods. In the figure, a plurality of parallel permalloy rods 11 having a length L of, for instance, about 5 mm, and a diameter d of about 0.4 mm lying in the direction of X and Y, or perpendicular to the sides of magnetic bubble memory chip 2 are arranged symmetrically in respect of the center of the chip 2. Each of the permalloy rods 11 is fixedly arranged in such a fashion that its center or longitudinal axis is on substantially the same plane as that of a magnetic film 2a formed on the major surface of the magnetic bubble memory chip 2 as shown in FIG. 9B. Taking a square chip 2 having a side of 6 mm, for example, 10 permalloy rods are associated with one side. These rods are disposed at an equal spacing or, preferably, at a spacing tapering off toward outside. If the bottom of the recess where the chip 2 is seated and the bottom of the recess where the permalloy rods 11 are seated are levelled differently, then the permalloy rods may easily be fixed in a manner mentioned above.

Figure 10:
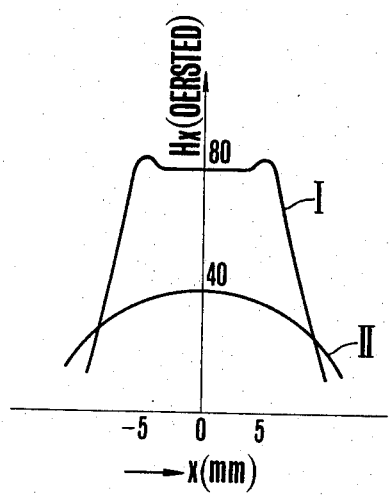
FIG. 10 is a graph showing the intensity distribution in the direction of X of the rotating magnetic field generated by X coil and amplified by the permalloy rods arrangement shown in FIGS. 9A and 9B.

In the magnetic bubble memory device constructed as above, a portion of the rotating magnetic field created by X, Y coils 6, 7 for generating rotating magnetic field magnetizes a plurality of permalloy rods 11 responding to this rotating magnetic field, and thus created rotating magnetic field is added to the rotating magnetic field directly applied to the chip 2 to amplify and apply the same on the chip 2. Therefore, the chip 2 operates the magnetic bubbles by the rotating magnetic field thus added and amplified. When the magnetic field distribution in the direction of x was measured of the component Hx of the rotating magnetic field on the surface of the magnetic bubble memory chip 2, it was revealed as shown in FIG. 10 but the magnetic field distribution was uniformly obtained throughout the area of the chip 2 which was about 2 times stronger, as shown by curve I, than the magnetic field distribution (represented by curve II) generated only by X coil 6 without the provision of permalloy rods 11. Obviously, a similar result was obtained in respect of the magnetic field distribution in the direction y of the component y of the rotating magnetic field.

Figure 11A:
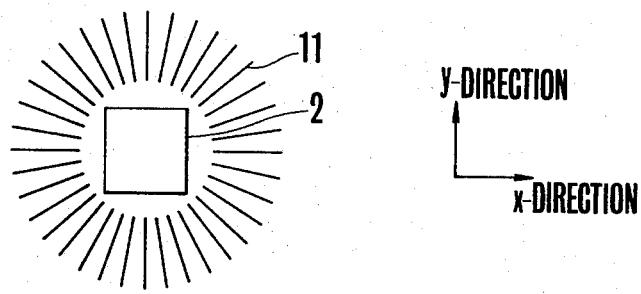
FIGS. 11A and 11B are respectively a plan view and a cross-sectional view showing a modified arrangement of permalloy rods.
Figure 11B:
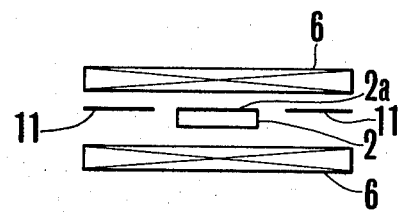

FIG. 11A shows another example of a permalloy rod arrangement. In the figure, in the extension of the upper surface of the magnetic bubble memory chip 2 are radially arranged in respect of the center of the chip 2 a plurality of permalloy rods having a length L of about 5 mm and a diameter d of about 0.4 mm and these permalloy rods 11 are fixedly arranged in such a way that the center or longitudinal axes of respective permalloy rods 11 are on substantially the same plane as the magnetic film 2a on the magnetic bubble memory chip 2 as shown in FIG. 11B. For a square chip having a side of 6 mm, 36 permalloy rods are provided.

Figure 12:
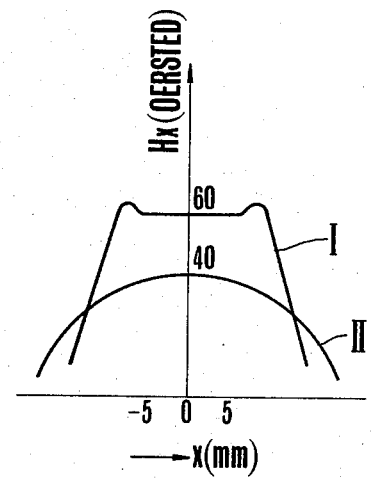
FIG. 12 is a graph showing intensity distribution in the direction of X of the rotating magnetic field generated by X coil and amplified by the arrangement of permalloy rods shown in FIGS. 11A and 11B.

The magnetic bubble memory device constructed in the above manner achieves a uniform magnetic field intensity thoughout the whole area of the chip 2 which is about 1.5 times, as shown at curve I in FIG. 12, stronger than the magnetic field distribution (curve II) of the magnetic field generated only by X coil 6 without providing for permalloy rods 11.

When comparing, in respect of the power consumption, the rotating magnetic field generating coil accompanied by permalloy rods of the above mentioned two embodiments with the conventional rotating magnetic field generating coil where no permalloy rods are provided, the conventional coil required 1.6 W in order to obtain the rotating magnetic field of about 80 Oersteds, whereas the first embodiment of the present invention required only 0.4 W and the second embodiment 0.7 W, and the temperature rise in the chip 2 was reduced from 70° C. of the conventional coil to 15° to 20° C. As for the ultimate operation margin, it is now possible with the magnetic circuit in accordance with the present invention to operate the magnetic bubble memory chip, which was inoperative in the prior art because of the high temperature of the chip, with a wide bias magnetic field margin of more than 30 Oersteds.

In the above mentioned embodiment, individual soft ferromagnetic rods such as made of permalloy were arranged circumferentially of the magnetic bubble memory chip. However, it is possible to mould the plurality of soft ferromagnetic rods arranged in a predetermined pattern into an annular sheet dimensioned to encircle the chip, and place the sheet circumferentially of the chip. It is also possible to coat and print the soft ferromagnetic material powder of permalloy in the form of rods in a predetermined pattern on an annular film dimensioned to encircle the chip. The film with the rods can readily be placed circumferentially of the chip.

In the above mentioned embodiments, explanation was made of permalloy rods as the soft ferromagnetic material, but the present invention is not to be limited to this material alone; similar effects may be achieved when ferrite, iron, nickel or their alloys are used. Moreover, the invention is not to be limited to the rods of soft ferromagnetic material, but sheet-shaped bars or hollow bars may also be used for achieving similar effects.

As discussed above in detail, the magnetic bubble memory device in accordance with the present invention has rod-like members made of soft ferromagnetic material arranged in the magnetic field created by the rotating magnetic field generating coils, and by magnetizing the rod-like members by the rotating magnetic field, the intensity of the rotating magnetic field may be amplified uniformly througout the whole area of the chip without changing the amplitude of the current supplied to the coils. Thus, it is possible to decrease the consumption of power supplied to the rotating magnetic field generating coils and improve the operation margin. Accordingly, it is possible to minimize VI product of the rotating magnetic field generating coil and miniaturize the coil, and further enable IC with smaller allowable voltage to be used for the driving circuit. The present invention thus achieves extremely excellent effects such as providing a miniaturized device with a large capacity at low cost.

What is claimed is:

1. In a magnetic bubble memory device comprising an insulating substrate, a magnetic bubble memory chip placed within a recess formed in the approximate center of said insulating substrate, and rotating magnetic field generating coils wound around the outer periphery of the insulating substrate so as to encircle the chip, said device operating under a bias magnetic field vertical to said magnetic bubble memory chip and a rotating magnetic field parallel to said chip, the improvement which comprises a plurality of rod-like members made of soft ferromagnetic material and placed in a second recess formed in said substrate to surround said chip, being on a plane substantially the same as the major surface of said chip.

2. A magnetic bubble memory device according to claim 1 wherein said plurality of rod-like members are arranged in the directions of components x, y of the rotating magnetic field.

3. A magnetic bubble memory device according to claim 1 wherein said plurality of rod-like members are radially arranged in respect of the center of the chip.

4. A magnetic bubble memory device according to claims 1 or 2 or 3 wherein said plurality of rod-like members are moulded into an annular sheet dimension to encircle the chip, said sheet comprising a plurality of soft ferromagnetic rods arranged in a predetermined pattern.

5. A magnetic bubble memory device according to claims 1 or 2 or 3 wherein said plurality of rod-like members comprise soft ferromagnetic material powder coated and printed in the form of rods in a predetermined pattern on an annular film dimensioned to encircle the chip.

6. A magnetic bubble memory device according to claims 1 or 2 or 3 wherein said soft ferromagnetic material is permalloy.

* * * * *